US006545472B2

United States Patent
Prüssmann et al.

(10) Patent No.: US 6,545,472 B2
(45) Date of Patent: Apr. 8, 2003

(54) MAGNETIC RESONANCE IMAGING METHOD WITH SUB-SAMPLING

(75) Inventors: Klaas Paul Prüssmann, Zürich (CH); Markus Weiger, Zürich (CH); Peter Börnert, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/814,391

(22) Filed: Mar. 21, 2001

(65) Prior Publication Data

US 2002/0014889 A1 Feb. 7, 2002

(30) Foreign Application Priority Data

Mar. 24, 2000 (EP) .............................. 00201065

(51) Int. Cl.[7] ................................. G01V 3/00
(52) U.S. Cl. ...................... 324/307; 324/309
(58) Field of Search ................. 324/309, 307, 324/310, 311, 312, 313, 314, 306, 300; 600/410

(56) References Cited

U.S. PATENT DOCUMENTS

| 5,587,656 A | * | 12/1996 | Van Heels-Bergen et al. | 324/307 |
| 5,910,728 A | * | 6/1999 | Sodickson | 324/309 |
| 6,289,232 B1 | * | 9/2001 | Jakob et al. | 600/410 |

OTHER PUBLICATIONS

Daniel K. Sodickson XP–002175143 article "A Generalized Basis Approach to Spatial Encoding with Coil Arrays: SMASH–SENSE Hybrids and Improved Parallel MRI at High Accelerations". Proceedings of the International Society for Magnetic Resonance in Medicine.*
Daniel K. Sodickson XP–002174628 article "Tailored SMASH Image Reconstructions for Robust In Vivo Parallel MR Imaging". Magnetic Resonance in Medicine vol. 44 pp. 243–251 Mar. 20th 2000.*
Sense: Sensitivity Encoding for Fast MRI: by Klaas P. Pruessmann, Markus Weiger, Markus B. Scheidegger and Peter Boesiger in Magnetic Resonance in Medicine 42:952–962(1999).
"Spiral Sense: Sensitivity Encoding with arbitrary K–space Trajectories" by Klaas P. Pruessmann, Markus Weiger, Peter Boernert, Peter Boesiger in Proceedings of the International Society for Magnetic Resonance in Medicine, Seventh Scientific Meeting and Exhibition, Philadelphia, Pennsylvania, USA, 22–28, May 1999, vol. 1, p. 94.

* cited by examiner

Primary Examiner—Edward Lefkowitz
Assistant Examiner—Tiffany A. Fetzner
(74) Attorney, Agent, or Firm—John Vodopia

(57) ABSTRACT

A magnetic resonance imaging method is proposed wherein a magnetic resonance image is reconstructed from magnetic resonance signals from respective signal channels. More specifically, individual signal channels relate to respective surface coils which are employed as receiver antennas for the magnetic resonance signals. The magnetic resonance signals are acquired with sub-sampling of the k-space. Resampling on a regular square grid is performed, thus enabling fast Fourier transformation in the reconstruction of the magnetic resonance image. Furthermore, the reconstruction is carried out on the basis of the spatial sensitivity profile of the receiver antennas, i.e. of the surface coils, so as to separate contributions from different spatial positions in the sub-sampled magnetic resonance signals. Preferably, a spiral-shaped acquisition trajectory is followed in the k-space.

9 Claims, 1 Drawing Sheet

MAGNETIC RESONANCE IMAGING METHOD WITH SUB-SAMPLING

BACKGROUND OF THE INVENTION

1. Field of the Invention

The invention relates to a magnetic resonance imaging method for forming a magnetic resonance image, wherein magnetic resonance signals are acquired by receiving antennas via a plurality of signal channels, which individual receiving antennas have respective sensitivity profiles. The invention also relates to a magnetic resonance system.

2. Description of the Related Art

A magnetic resonance imaging method and a magnetic resonance system for carrying out such a magnetic resonance imaging method are known from the article "Coil Sensitivity Encoding for Fast MRI" by K.P. Prüssmann et al. in Proceedings ISMRM (1998), 579.

The known magnetic resonance imaging method is known by the acronym SENSE method. This known magnetic resonance imaging method utilizes receiving antennas in the form of receiving coils. This magnetic resonance imaging method utilizes sub-sampling of the acquired magnetic resonance signals so as to reduce the time required to scan the k-space at a sampling density in the k-space for the desired field-of-view and over a region in k-space which is large enough for the desired spatial resolution of the magnetic resonance image. Notably the respective lines in the k-space along which scanning is performed are situated apart further in the k-space than is necessary for the desired spatial resolution. In other words, "lines are skipped" in the k-space. As a result of such "skipping of lines in the k-space", less time is required for the acquisition of the magnetic resonance signals. Receiving coil images are reconstructed on the basis of the sub-sampled magnetic resonance signals from the individual receiving coils. Due to the sub-sampling, the actual field of view is reduced so that back-folding or aliasing artefacts occur in such receiving coil images. The magnetic resonance image is derived from the receiving coil images on the basis of the sensitivity profiles, the aliasing artefacts in the magnetic resonance image thus being substantially or even completely removed. This unaliasing operation enlarges the magnetic resonance image to the desired field of view.

It has been found in radiological practice the time required for the acquisition of the magnetic resonance signals need still be reduced considerably further. It has been found that a substantial reduction of the acquisition time of the magnetic resonance signals is necessary notably for magnetic resonance imaging methods for the imaging with a high spatial resolution of fast moving parts of the anatomy, for example the beating heart of a patient under stress, but also for MR angiography.

SUMMARY OF THE INVENTION

It is an object of the invention to provide a magnetic resonance imaging method wherein the acquisition time of the magnetic resonance signals is significantly shorter than the acquisition time required when the known SENSE technique is used.

This object is achieved by the magnetic resonance imaging method according to the invention wherein the noise correlation between individual signal channels is represented by a noise correlation matrix, where the magnetic resonance signals are acquired with sub-sampling, regularly resampled magnetic resonance signals are resampled on a regular sampling grid from the acquired magnetic resonance signals, the noise correlation matrix is approximated by a block diagonal matrix or a band diagonal matrix, the matrix elements situated outside a predetermined band around the main diagonal of the approximated noise correlation matrix have the value zero, and the magnetic resonance image is reconstructed from the regularly resampled magnetic resonance signals which have been resampled from acquired magnetic resonance signals on the basis of the sensitivity profiles and the approximated noise correlation matrix.

The magnetic resonance image is derived from the magnetic resonance signals sub-sampled in the k-space while utilizing the sensitivity profiles. Sub-sampling means that the sampling in the k-space is coarser, i.e. with a resolution in the k-space which is coarser than sufficient for the field of view of the magnetic resonance image. In a magnetic resonance imaging method the smallest wavelength of brightness variations in the magnetic resonance image relates to the field of view. The smallest wavelength is notably proportional to the magnitude of the field of view and to the sampling density in the k space. In the case of sub-sampling the sampling is coarser than sufficient for the desired size of the field-of-view of the magnetic resonance image. The signal values are encoded on the basis of their wave vectors in the k-space and on the basis of the sensitivity profiles. The magnetic resonance signals of the respective receiving antennas correspond to respective signal channels. The noise contribution to the signals in each of the signal channels is a linear combination of noise contributions from the relevant signal channel and from (in principle) all other signal channels. The receiving antennae are, for example receiving coils that are sensitive to the magnetic resonance signals. Preferably, surface coils are used as the receiving antennas. Such surface coils are arranged on the body of the patient to be examined and pick up notably magnetic resonance signals which are generated in the body of the patient to be examined in positions situated near the surface coil. The noise correlation between the signal channels is represented by a noise correlation matrix. For realistic numbers of magnetic resonance signals for a magnetic resonance image of diagnostic quality, the decoding of the magnetic resonance signals in the k-space and on the basis of the sensitivity profiles into pixel values for individual pixel positions in an image matrix constitutes, if no steps are taken, a matrix inversion problem requiring a high calculation capacity and long calculation times.

The noise correlation matter may be approximated by the unity matrix, a block diagonal matrix or a two diagonal matrix, which are all special examples of block diagonal or band diagonal matrices. Reconstruction of the magnetic resonance image from the sub-sampled magnetic resonance signals on the basis of the SENSE-algorithm includes optimisation of noise properties in the magnetic resonance image. This optimisation involves a noise correlation matrix which contains in the the diagonal elements noise in the sampled magnetic resonance signals and in the off-diagonal elements noise correlations between respective sampled magnetic resonance signals acquired by different receiver antennae. It appears that as an approximation the noise correlation matrix may be replaced by the unity matrix. An alternative, more subtle, approximation is based on the recognition that the noise correlations are about constant over time. Hence, it appears that the noise correlation can adequately be described by a matrix having a sparse structure, i.e. approximately (block) diagonal. This sparse sructure allows a virtual re-sampling or re-binning of the sub-sampled magnetic resonance signals from the respective receiver coils into virtual channels as linear combinations of the sub-sampled magnetic resonance signals from the individual receiver coils. The weights involved in this linear combination are obtained from the so-called Cholesky decomposition of the noise correlation matrix into a matrix product of an invertible left triangular matrix and its Hermitian conjugate. Then, the effective noise correlation matrix connecting the virtual channels is the unit matrix. It has been found according to the invention that in practice the correlation between noise contributions in the magnetic resonance signals from individual receiving antennas can be suitably approximated by a simpler matrix with contributions from only the vicinity of the main diagonal. It has even been found that this noise correlation may be replaced by the unity matrix. It has even been found that such a simplification strongly mitigates the matrix inversion problem, so that only a comparatively short calculation time and a limited calculation capacity are required. The magnetic resonance image can thus be reconstructed from the magnetic resonance signals within a short period of time. It has also been found in practice that a 128×128 image matrix (so N=128) can be reconstructed from the sub-sampled magnetic resonance signals within one minute. It has also been found that the approximation of the noise correlation matrix in the reconstruction of the magnetic resonance image on the basis of the sensitivity profiles does not have significant adverse effects on the diagnostic quality of the magnetic resonance image. This means that the magnetic resonance image has a suitable contrast resolution so that details of low contrast are suitably visibly reproduced in the magnetic resonance image. The reconstruction time of the magnetic resonance image is further reduced notably by applying a known fast Fourier transformation to the regularly resampled magnetic resonance signals. Regular (re)sampling means that the magnetic resonance signals in the k-space are sampled on a regular square grid. It has been found that for an N×N image matrix this simplification leads to a reduction of the matrix inversion problem from the order of magnitude $N^4$ to the order of magnitude $N^2$ or $N^2 \log N$.

The invention offers a high degree of freedom in choosing the acquisition trajectory to be followed through the k-space for the acquisition of the magnetic resonance signals. Such an acquisition trajectory according to the invention may give rise to irregular sampling of the k-space. It is notably not necessary to perform the sampling on a regular square grid in the k-space during the acquisition of the magnetic resonance signals. Thus, for example, respective parts of the k-space can be traversed at different speeds. The invention notably offers the possibility of choosing an essentially spiral-shaped trajectory through the k-space. Magnetic resonance signals are then acquired first from a central part of the k-space, so with wave vectors of comparatively small magnitude, after which magnetic resonance signals are acquired with a continuously faster increasing magnitude of the wave vector. Such an acquisition along a spiral-shaped trajectory, or a trajectory comprising one or more spiral-shaped steps in the k-space, is particularly suitable for use in MR angiography. Therein, magnetic resonance images of a patient to be examined are formed immediately after the administration of a contrast medium to the patient, for example an intravenously injected medium. The magnetic resonance signals from the center of the k-space relate mainly to rather coarse structures in the magnetic resonance image, including the arterial part of the vascular system of the patient to be examined. The venous part of the vascular system involves mainly much finer structures. When a spiral-shaped trajectory is followed, the magnetic resonance signals can be acquired from the arterial part before the contrast medium reaches the veins. Because, moreover, sub-sampling is applied, the acquisition of the magnetic resonance signals will not require much time. The combination of sub-sampled acquisition of the magnetic resonance signals and scanning the k-space along a spiral-shaped trajectory enables fast acquisition of magnetic resonance images of the arterial part of the vascular system with a high spatial resolution.

Preferably, respective receiving coil images are reconstructed from the magnetic resonance signals from individual signal channels and from individual receiving antennas. Receiving coils are preferably used as the receiving antennas. Due to the sub-sampling of the magnetic resonance signals from the individual signal channels, aliasing artefacts such as fold-back phenomena occur in such receiving coil images. The reconstruction of the receiving coil images utilizes the approximated noise correlation matrix according to the invention. The magnetic resonance image is derived from the receiving coil images on the basis of the sensitivity profiles. The reconstruction of the magnetic resonance image on the basis of the receiving coil image and the sensitivity profiles is known per se as the SENSE method. This SENSE method is known per se from the article by Prüssmann et al. in Proceedings ISMRM (1998), 579, and from the article by Prüssmann and Weiger in MRM42 (1999), pp. 952–962. The SENSE method enables sub-sampled acquisition of the magnetic resonance signals, thus reducing the time required for the acquisition of the magnetic resonance signals.

It is alternatively possible to form magnetic resonance signals with full sampling from the sub-sampled magnetic resonance signals, while utilizing the sensitivity profiles, by combination of the sub-sampled magnetic resonance signals. The magnetic resonance image is reconstructed from the magnetic resonance signals obtained by combination. Various magnetic resonance signals in the k-space are then combined so as to fill in the lines in the k-space which have been skipped during the acquisition. This method is known by the acronym SMASH and is known per se from U.S. Pat. No. 5,910,728.

When receiving coils or surface coils are used as the receiving antennas, the coil sensitivity profiles of the receiving coils correspond to the sensitivity profiles of the receiving antennas.

Preferably, the receiving coils are preferably decoupled essentially inductively. As the degree of inductive coupling of the receiving coils is lower, the noise level and noise correlation are lower. The noise level of the magnetic resonance image is thus reduced.

Preferably, an iterative inversion algorithm is used for the reconstruction of the magnetic resonance image. That is, the magnetic resonance image is reconstructed by iteration from the sub-sampled magnetic resonance signals. Starting with some initial vector, iterative algorithms yield a progression of approximate solutions, which converges to the exact solution. A variety of such techniques exist for the treatment of large linear systems. The so-called conjugate-gradient (cg) method is particularly suited. On the one hand, it may be combined with FFT for very efficient calculations. On the other hand, the CG iteration does not require particular provisions for ensuring convergence. It converges safely given that the matrix involved is positive definite, which holds true for the matrix that connects the pixel-values of the reconstructed magnetic resonance image to the sub-sampled magnetic resonance signals through the gradient encodings and the coils sensitivity profiles. The CG algorithm theoretically yields the exact solution of an $N^2 \times N^2$ system after at most N2 iterations. For N in the range of 128, though, it is not practical to carry out the entire procedure until mathematically strict convergence is achieved. However, in practice it appears that approximations leading to a good diagnostic quality for the reconstructed magnetic resonance image are obtained after a relatively small number of iterations already. Each CG iteration step consists in multiplying the matrix to be inverted with a residuum vector and several further calculations of minor complexity. Thus the iteration speed depends crucially on how fast matrix-vector multiplication can be performed. The number of iterations necessary to achieve a given accuracy is related to the so-called condition of the matrix to be inverted and the suitability of the starting vector. Because the dimensionality and size of the matrix inversion for the method according to the invention, iterative inversion algorithms are faster than, for example, direct inversion algorithms. Particularly favorable results are achieved, for example, by a Jacobi procedure, a Gauss-Seidel procedure or conjugated gradient (CG) methods.

The invention also relates to a magnetic resonance imaging system suitable for carrying out the magnetic resonance imaging method according to the invention.

The magnetic resonance imaging system according to the invention includes a control unit with a computer provided with a (micro)processor whereby the temporary gradient fields and RF excitations are controlled. The functions of a magnetic resonance imaging system according to the invention are carried out preferably by a suitably programmed computer or (micro)processor or a special purpose processor provided with integrated electronic or optoelectronic circuits especially designed for the execution of one or more of the magnetic resonance imaging methods according to the invention.

The invention also relates to a computer program with instructions for executing a magnetic resonance imaging method. It is a further object of the invention to provide a computer program whereby one or more of the magnetic resonance imaging methods according to the invention can be carried out. When such a computer program according to the invention is loaded into the computer of a magnetic resonance imaging system, the magnetic resonance imaging system can execute one or more magnetic resonance imaging methods according to the invention. Thus, on the basis of the instructions of the computer program according to the invention the technical effects can be realized for producing magnetic resonance images according to the invention. For example, a magnetic resonance imaging system according to the invention is a magnetic resonance imaging system whose computer is loaded with a computer program according to the invention. Such a computer program can be stored on a carrier such as a CD-ROM. The computer program is then loaded into the computer by reading the computer program from the carrier, for example by a CD-ROM player, and by storing it in the memory of the computer of the magnetic resonance imaging system. It is to be noted, however, that it is also possible to load the computer program according to the invention into the memory of the computer of the magnetic resonance imaging system via a network, for example the worldwide web.

These and other aspects of the invention are apparent from and will be elucidated, by way of non-limitative example, with reference to the embodiments described hereinafter and the accompanying drawing.

BRIEF DESCRIPTION OF THE DRAWING

The FIGURE shows diagrammatically a magnetic resonance imaging system in which the invention is used.

DETAILED DESCRIPTION OF THE PRESENTLY PREFERRED EMBODIMENT

Figure 1:
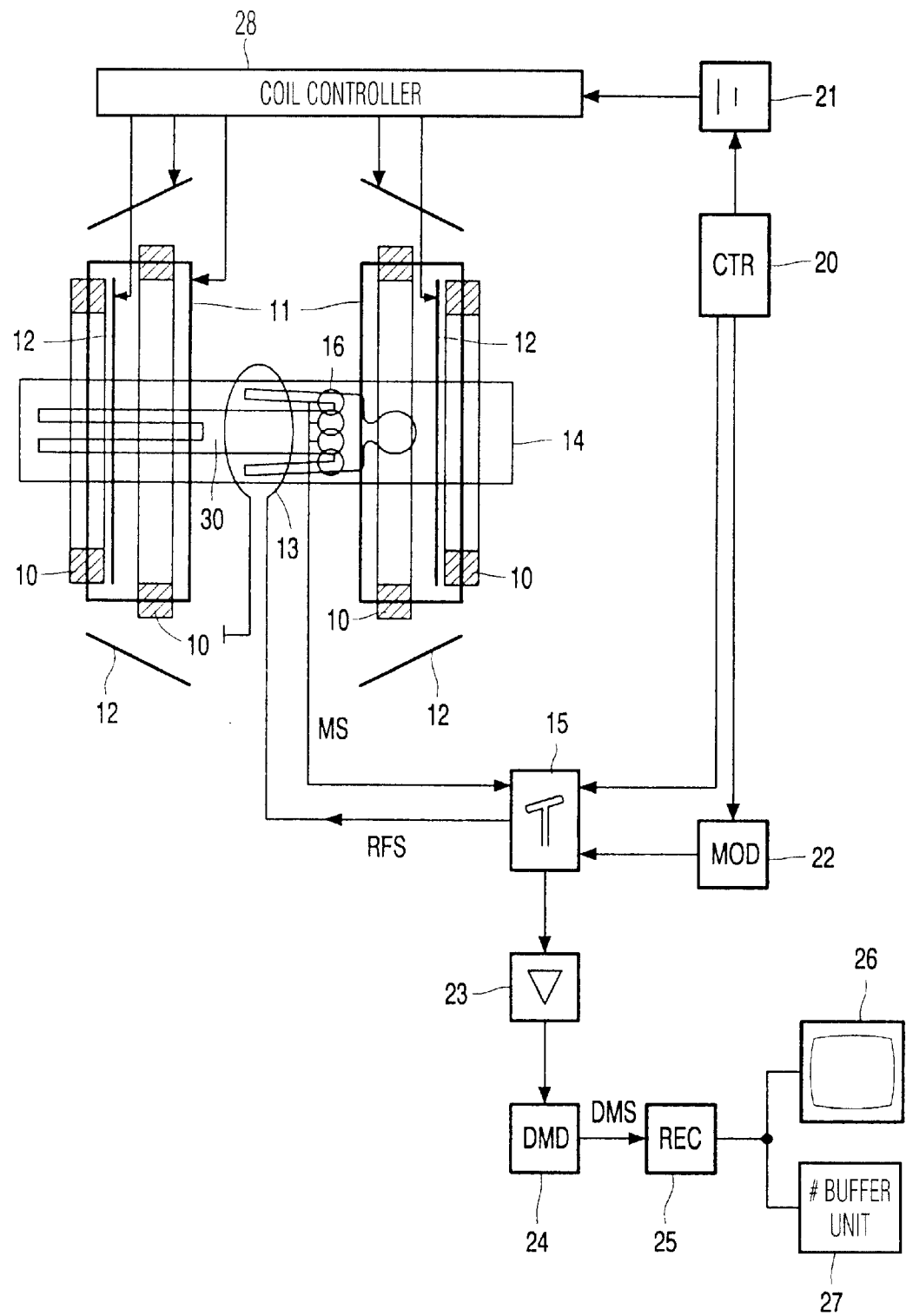

The Figure shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21 via a conventional coil controller 28. The gradient coils 11, 12 are energized by application of an electric current by the power supply unit 21. The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged on a table 14 in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that it is alternatively possible to use separate receiving coils 16. For example, surface coils 16 can be used as receiving coils. Such surface coils have a high sensitivity in a comparatively small volume. The transmission coils, such as the surface coils, are connected to a demodulator 24 and the received magnetic resonance signals (MS) are demodulated by the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction unit is applied to a monitor 26, so that the monitor can display the magnetic resonance image. It is alternatively possible for the magnetic resonance signals to represent a three-dimensional density distribution. Such a three-dimensional density distribution can be displayed on the monitor 26 in various ways; for example, projections to be selected by the user are displayed or stereoscopic pairs of images. It is alternatively possible to store the signal from the reconstruction unit 25 in a buffer unit 27 while awaiting further processing.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25.

From the magnetic resonance imaging method which is known as the SENSE method the following relation is known to exist between the measured magnetic resonance signals (m) and the brightness or contrast values (I):

$$I = (E^H \Psi^{-1} E)^{-1} E^H \Psi^{-1} m \quad (1)$$

The encoding matrix E therein relates to the spatial encoding in the k-space on the basis of the wave vector of the magnetic resonance signals as well as to the spatial encoding by the sensitivity profiles $(s_\gamma)$ $(r_\rho)$, where the index $\gamma$ represents the relevant surface coil and $r_\rho$ the position of the relevant volume element or voxel in the object to be examined. $E^H$ denotes the complex adjoint of the encoding matrix. The noise correlation matrix is denoted as $\Psi$, having the matrix elements:

$$\Psi_{\gamma\eta} = \sum_\tau \omega_{\gamma\tau} \sigma_\tau^2 \omega_{\tau\eta}^* \quad (2)$$

where $\sigma_\tau$ represents the standard deviation of the noise in the signal channel $\tau$ and $\omega_{\gamma\tau}$ represents the weighing factor of the contribution to the noise in the signal channel $\gamma$ by the signal channel E.

The encoding matrix E thus has the matrix elements:

$$E_{\gamma,\kappa,\rho} = S_\gamma(r_\rho) e^{ik_\kappa r_\rho} \quad (2)$$

Therein, $S_\gamma(r_\rho)$ denotes the spatial sensitivity profile at the area $r_\rho$ of the receiving antenna, notably the surface coil $\gamma$.

According to the invention the noise correlation matrix $\Psi$ can be adequately approximated by a block diagonal matrix, or even by the unity matrix; this is notably so when the surface coils are inductively decoupled. The effective encoding is then reduced to $$I = (\hat{E}^H \hat{E})^{-1} \hat{E}^H m \quad (3)$$

In the more subtle approach it is assumed that noise correlation between different coils is constant over time as the underlying mechanisms are invariant. Receiver noise is then described by a sparse, i.e. block-diagonal matrix with a simple structure:

$$\Psi_{(\gamma,\kappa),(\gamma',\kappa')} = \Psi_{\gamma,\gamma'} \delta_{\kappa,\kappa'}.$$

The time-independent, matrix $\Psi$ can be determined experimentally by statistical analysis of reference noise samples taken in the absence of MR signal. Let $\eta_\gamma$ denote the noise output of the -th channel. Then the entries of $\Psi$ are given by $$\Psi_{\gamma,\gamma'} = \overline{\eta_\gamma \eta_{\gamma'}^*},$$

where the bar indicates time averaging. In this approach noise correlation of simultaneously acquired magnetic resonance signals is fully accounted for.

With such simplified noise statistics, the noise variance matrix can be eliminated by a simple trick. The basic idea is to create a set of virtual receiver channels by linear combination of the original ones, such that the virtual channels exhibit unit noise levels and no mutual noise correlation. Suitable weighting coefficients for this purpose are given by the inverse of the matrix L obtained by the Cholesky decomposition $$\Psi = L L^H.$$

Virtual sampling data with decorrelated unit noise are thus obtained from the original samples by $$m_{\gamma,\kappa}^{decorr} = \sum_{\gamma'} (L^{-1})_{\gamma,\gamma'} m_{\gamma',\kappa}.$$

The net coil sensitivities associated with the virtual channels are given likewise by $$s_\gamma^{decorr}(r) = \sum_{\gamma'} (L^{-1})_{\gamma,\gamma'} s_{\gamma'}(r),$$

$$(\hat{E}^H \hat{E})_{\rho,\rho'} = \sum_\gamma \hat{s}_\gamma^*(r_\rho) \hat{s}_\gamma(r_{\rho'}) \left( \int e^{-ik(r_\rho - r_{\rho'})} \left( \sum_\kappa \delta(k_\kappa - k) \right) dk \right)$$

leading to the modified encoding matrix $$E_{(\gamma,\kappa),\rho}^{decorr} = e^{ik_\kappa r_\rho} s_\gamma^{decorr}(r_\rho).$$

With sample values and sensitivities modified in this fashion, the newly combined channels can be treated exactly like physical ones. The noise variance matrix of the virtual channels is equal to identity and can thus be omitted when Eq.[6] is reformulated for image reconstruction from the modified data. Note that by the transition to virtual channels the solution of Eq.[6] is not altered (see Appendix B). In particular, the optimisation of SNR is preserved.

Both options, decorrelation on the one hand, and neglecting noise correlation on the other hand, lead to the same simplified formula. Dropping the superscript for decorrelation, and indicating again the approximated encoding matrix as $\hat{E}$ it reads in both cases (cf. eq. (3) above):

$$(\hat{E}^H \hat{E}) I = \hat{E}^H m.$$

The approximated encoding matrix is now represented by the reference $\hat{E}$. It has been found that this matrix inversion problem can be quickly numerically solved by iterative inversion. The data m are the signal values (amplitude and phase) of the magnetic resonance signals. The code in (3) includes an inverse Fourier transformation, so that $$I = \Omega \Im^{-1} m \quad (4)$$

Therein, $\Omega$ is a generic representation of the residual codes, so apart from the inverse Fourier transformation. This can be more exactly written as vector and matrix elements:

$$(\hat{E}y)_{(\gamma,\kappa)} = \int e^{-ik_\kappa r}\left(\sum_\rho y_\rho \hat{s}_\gamma(r_\rho)\delta(r_\rho - r)\right)dr$$

$$(\hat{E}^H m)_\rho = \sum_\gamma \hat{s}^*_\gamma(r_\rho)\left(\int e^{-iknr_\rho}\left(\sum_k m_{(\gamma,\kappa)}\delta(k_\kappa - k)\right)dk\right)$$

For fast execution of the inverse Fourier transformations, a so-called "gridding" transformation is performed on the measured data on a regular square grid in the k-space:

$$\tilde{m} = G(x)m,$$

where G is, for example, a Gaussian convolution kernel:

$$\tilde{m}_\kappa = \Sigma G(\kappa - \kappa')m(\kappa') \quad (5)$$

Therefore:

$$I = \Omega \frac{1}{\hat{G}} \mathcal{J}^{-1} G \otimes m \quad (6)$$

Therein, the inverse Fourier transformation can be quickly executed by known fast Fourier transformation (FFT) algorithms. The integrals in these expressions are efficiently calculated by FFT with gridding preparation using Kaiser-Bessel windows and two-fold oversampling. The computational cost of evaluating each of these equations is on the order of only $N^2 \log N$ as opposed to $N^4$ for normal matrix-vector multiplication. The storing of the function f in eq. [5] requires memory size on the order of $N^2$ instead of $N^4$ for straightforward storing of $\hat{E}^H\hat{E}$. For the repeated evaluation of $\hat{E}^H\hat{E}$ y, the gridding approach can be taken advantage of in two ways:

One can calculate and store the integral initially and perform common matrix-vector multiplication, creating the entries of $\hat{E}^H\hat{E}$ row by row without storing them. This procedure has the advantage that it is compatible with the Gauss-Seidel-method, which often converges faster than the other methods. Onthe other hand the complexity of one matrix-vector multiplication remains essentially $N^4$.

One can perform the evaluation of $\hat{E}^H\hat{E}$ y in two successive gridding and FFT steps, This has the advantage that the cost for the matrix-vector multiplication is only on the order of $N^2 \log N$ and that the procedure is easily implementable on parallel processing hardware.

Furthermore, the magnetic resonance image is reconstructed from the residual code in the code $\Omega$ by iterative inversion. Generally speaking, such iterative inversions can be written as:

$$I^{(i+1)} = I^{(i)} + \alpha \Delta(m^{(i)}, m^{(i-1)}),$$

where the signal data $m^{(i)}$ is calculated on the basis of the residual code $\Omega$ from the reconstructed image data $I^{(i)}$. Each time a new estimate of the image data $I^{(i+1)}$ is formed on the basis of the difference function $\Delta$, which new estimate more closely fits each time the signal data measured by the magnetic resonance signals. T he iteration commences with an estimate of the image data $I^{(O)}$ and the measured magnetic resonance signals $m^{(O)}$.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

What is claimed is:

1. In a magnetic resonance imaging system including a plurality of receiver antennas for acquiring a plurality of magnetic resonance signals via a plurality of signal channels, wherein each receiver antenna has a respective sensitivity profile and wherein a noise correlation between individual signal channels is represented by a first noise correlation matrix, a magnetic resonance imaging method for forming a magnetic resonance image, said method comprising:
acquiring a plurality of magnetic resonance signals with sub-sampling;
resampling a plurality of regularly resampled magnetic resonance signals on a regular sampling grid from the acquired sub-sampling of magnetic resonance signals;
replacing the first noise correlation matrix with a second noise correlation matrix approximated by a block diagonal matrix or a band diagonal matrix, wherein matrix elements of the second noise correlation matrix situated outside a predetermined band around a main diagonal of the second noise correlation matrix have the value zero; and
reconstructing the magnetic resonance image from the regularly resampled magnetic resonance signals which have been sampled from the acquired magnetic resonance signals on the basis of the sensitivity profiles and the second noise correlation matrix.

2. The magnetic resonance imaging method of claim 1, wherein the second noise correlation matrix is a diagonal matrix.

3. The magnetic resonance imaging method of claim 1, wherein respective receiving coil images are reconstructed from the regularly resampled magnetic resonance signals from individual signal channels; and
wherein the magnetic resonance image is derived from the receiving coil images and the sensitivity profiles.

4. The magnetic resonance imaging method of claim 2 or 3, wherein the sensitivity profiles of individual receiving antennas are essentially decoupled from one another.

5. The magnetic resonance imaging method of claim 1, wherein the magnetic resonance image is reconstructed from the regularly resampled magnetic resonance signals by an iterative inversion algorithm.

6. The magnetic resonance imaging method of claim 1, wherein the magnetic resonance signals are acquired on a basis of a trajectory through a k-space which corresponds to a sampling of the acquired magnetic resonance signals outside a regular grid of sampling points in the k-space.

7. The magnetic resonance imaging method of claim 6, wherein the trajectory through the k-space includes an essentially spiral-shaped segment.

8. A magnetic resonance imaging system for forming a magnetic resonance image, said magnetic resonance system comprising:

a plurality of receiving antennas for acquiring magnetic resonance singals via a plurality of signal channels,
wherein individual receiving antennas have respective sensitivity profiles, and the noise correlation between individual signal channels is represented by a first noise correlation matrix;

means for acquiring a plurality of magnetic resonance signals with sub-sampling;

means for resampling a plurality of regularly resampled magnetic resonance signals on a regular sampling grid from the acquired sub-sampling of magnetic resonance signals;

means for replacing the first noise correlation matrix with a second noise correlation matrix approximated by a block diagonal matrix or a band diagonal matrix, wherein matrix elements of the second noise correlation matrix situated outside a predetermined band around a main diagonal of the second noise correlation matrix have the value zero; and means for reconstructing the magnetic resonance image from the regularly resampled magnetic resonance signals which have been sampled from the acquired magnetic resonance signals on the basis of the sensitivity profiles and the second noise correlation matrix.

9. In a magnetic resonance imaging system including a plurality of receiver antennas for acquiring a plurality of magnetic resonance signals via a plurality of signal channels, wherein each receiver antenna has a respective sensitivity profile and wherein a noise correlation between individual signal channels is represented by a first noise correlation matrix, a computer readable medium including a magnetic resonance imaging computer program for forming a magnetic resonance image, said computer program comprising:

computer readable code for acquiring a plurality of magnetic resonance signals with sub-sampling;

computer readable code for resampling a plurality of regularly resampled magnetic resonance signals on a regular sampling grid from the acquired sub-sampling of magnetic resonance signals;

computer readable code for replacing the first noise correlation matrix with a second noise correlation matrix approximated by a block diagonal matrix or a band diagonal matrix, wherein matrix elements of the second noise correlation matrix situated outside a predetermined band around a main diagonal of the second noise correlation matrix have the value zero; and computer readable code for reconstructing the magnetic resonance image from the regularly resampled magnetic resonance signals which have been sampled from the acquired magnetic resonance signals on the basis of the sensitivity profiles and the second noise correlation matrix.

* * * * *